United States Patent [19]

Stengl et al.

[11] Patent Number: 4,775,797

[45] Date of Patent: Oct. 4, 1988

[54] METHOD OF STABILIZING A MASK

[75] Inventors: Gerhard Stengl, Villach; Hans Löschner, Vienna, both of Austria

[73] Assignee: IMS Ionen Mikrofabrikations Systeme Gesellschaft mbH, Vienna, Austria

[21] Appl. No.: 930,805

[22] Filed: Nov. 13, 1986

[30] Foreign Application Priority Data

Nov. 13, 1985 [AT] Austria .................................. 3311/85

[51] Int. Cl.⁴ .............................................. G01J 1/00
[52] U.S. Cl. ................................ 250/503.1; 250/505.1
[58] Field of Search ............. 250/505.1, 492.21, 492.1; 430/5; 378/35

[56] References Cited

U.S. PATENT DOCUMENTS 4,112,307  9/1978  Föll et al. ......................... 250/505.1
4,307,556  1/1983  Stengl et al. ...................... 250/505.1

FOREIGN PATENT DOCUMENTS 3044257  7/1981  Fed. Rep. of Germany .

Primary Examiner—Bruce C. Anderson

[57] ABSTRACT

Our invention is a process for stabilizing a projection mask which is put in operation at an elevated temperature. The frame containing the mask foil is heated to a temperature which is higher than the temperature of the mask foil. The mask foil is thus kept under tension by controlling the temperature of the frame it is held in and distortions like the distortions which would otherwise occur in long time operation and as conditioned by the mask foil hanging through it are avoided. The effect of the expansion of the mask foil can be compensated in the image forming unit by correction of the image formation scale.

14 Claims, 1 Drawing Sheet

METHOD OF STABILIZING A MASK

FIELD OF THE INVENTION

Our present invention relates to a method of stabilizing a mask.

BACKGROUND OF THE INVENTION

A projection screen can have a mask in the form of a mask foil and a retaining frame for this mask foil which are subjected to a thermal stress in operation by a high-energy image forming medium or beam, for example, ions, electrons or X-rays. Regions permeable to the image-forming radiation, e.g. openings, are present in the mask foil.

The mask foil is advantageously combined with a metallic retaining frame.

Considerable distortions in the mask foil can be generated by a thermal stress applied to the mask foil, e.g. by the image-forming beam particularly when the mask foil does not have the same effective thickness at all points. Thus the thermal stressing of a mask foil of uniform thickness can lead to distortions of the openings in the foil so that the methods of thermal stressing can be used generally only for test masks in 1:1 ion or electron shadowography and/or in ion or electron beam image demagnifying projection.

OBJECTS OF THE INVENTION

It is an object of our invention to provide an improved process for stabilizing a mask which avoids these drawbacks.

It is also an object of our invention to provide an improved process for stabilizing a mask which permits application to the mask of a greater thermal load by an image-forming medium than has been possible up to now and simultaneously avoids an intolerable amount of distortion when a mask with structural openings is used.

SUMMARY OF THE INVENTION

These objects and others which will become more readily apparent hereinafter are attained in accordance with our invention in a process for stabilizing a mask comprising a mask foil and a retaining frame for it which are subjected to a thermal stress by an image-forming medium, for example a high-energy beam of ions, electrons or X-rays, which passes through a plurality of permeable regions in the mask foil.

According to our invention the mask, whose mask foil is mounted free of tension or with such a small tension in the retaining frame that a distortion associated with the tension is not present or is negligible, is clamped in the retaining or mounting frame and the retaining frame is heated in operation to a temperature which exceeds the temperature of the mask foil.

The mask foil can be combined with an anchoring piece, (e.g. bonded frame) by a standard manufacturing process. It is insured that the mask foil is only under a slight tension so that associated distortions of structure in or on the mask foil are not present during the image-forming process. Advantageously silicon or glass can be used as the material for the anchoring piece.

Methods for making mask foils from silicon (doped with quantities of boron and germanium) or from silicon nitride and mounting them in with a frame of silicon are already known. In these methods the thermal expansion coefficient of the anchoring frame can be the same or similar to that of the mask foil. The stabilizing method according to our invention can be used advantageously with such projection screens.

The effect achievable by the process of our invention is based on the phenomenon that the expansion that occurs upon heating the mask foil faces no significant resistance and thus the mask foil not only remains planar but also all structures in the mask foil are enlarged with the same linear factor (i.e. coefficient of thermal expansion) so that the distortion of the mask structure which is only slight at the beginning undergoes no increase and even tends to decrease.

In the process according to our invention, since the retaining frame is in contact with the mask foil, the retaining frame is heated in a controlled way and thus the mask foil heated by the image-forming medium can assume the required size unimpeded by the heating. In this way we achieve a completely stress free mask which can take a significantly higher thermal from load by the image forming medium.

Advantageously the mask foil is held in the retainer with a pretension corresponding to a stretch of $10^{-5}$ to $10^{-6}$ (ratio of elongation in a particular direction to the linear dimension in this direction), so that in the propagation of the image-forming medium through the mask, the structures of the mask formed in the substate manifest only slight distortions which are negligible. In practice the holder is heated typically by about 10° C. above the temperature of the mask to hold it exactly planar.

In this way only a very slight tension exists in the mask foil so that mechanical vibrations are not transferable to the stress-free mask and changes in the load on the mask foil by the image-forming medium can be allowed.

In order to guarantee that the mask foil does not undergo a plastic deformation by a temperature drop when the image-forming medium is absent, according to a further feature of our invention, on shut off of the image-forming medium the mask foil is brought to a temperature which is at least equal to the temperature of the mask foil at the time of shut off by a heating medium. The heating medium can be a fluid, an infrared emitting source or another particle beam source. In so far as the mask foil sags under the effect of heating this is not significant for further use of the foil since after a temperature drop the foil is again put under tension. The measurement of the mask temperature can be performed pyrometrically. Upon a tendency toward temperature drop, the additional heat source can be switched on. The additional source can be operated continuously with reduced intensity and can have its intensity increased when the image-forming beam is not detected.

On shut off of the image-forming medium, therefore, the intensity is correspondingly increased.

According to another aspect of the invention, we provide a method of operating a projection screen through which a high-energy beam is passed, comprising the steps of:

bonding a planar frame all around the periphery of a projection mask to form a projection screen, the frame and the mask having substantially the same coefficients of thermal expansion;

securing the projection screen in a mounting frame so that the screen at ambient temperature is subjected to an elongation of at most $10^{-5}$ measured as the ratio of the change in length of a unit length of the mask to the unit length caused by tension in the securing of the projection screen in the mounting frame; and heating the mounting frame to a temperature in excess of that developed in the mask upon the passage of the high-energy beam therethrough to maintain the mask in a planar state; and passing the high-energy beam through the screen.

Advantageously, the projection screen is subjected to tension in the mounting frame so as to generate in the mask an elongation of $10^{-5}$ to $10^{-6}$ therein.

Preferably the mounting frame is heated to a temperature of 10° C. to 20° C. above that required to maintain planarity of the mask.

The method also can comprise the step of detecting a termination of passage of the high-energy beam through the mask and at least concurrently with the detection supplying thermal energy to the mounting frame to prevent loss of planarity of the mask.

BRIEF DESCRIPTION OF THE DRAWING

The above and other objects, features and advantages of our invention will become more readily apparent from the following description, reference being made to the accompanying highly diagrammatic drawing in which.

SPECIFIC DESCRIPTION

Figure 1:
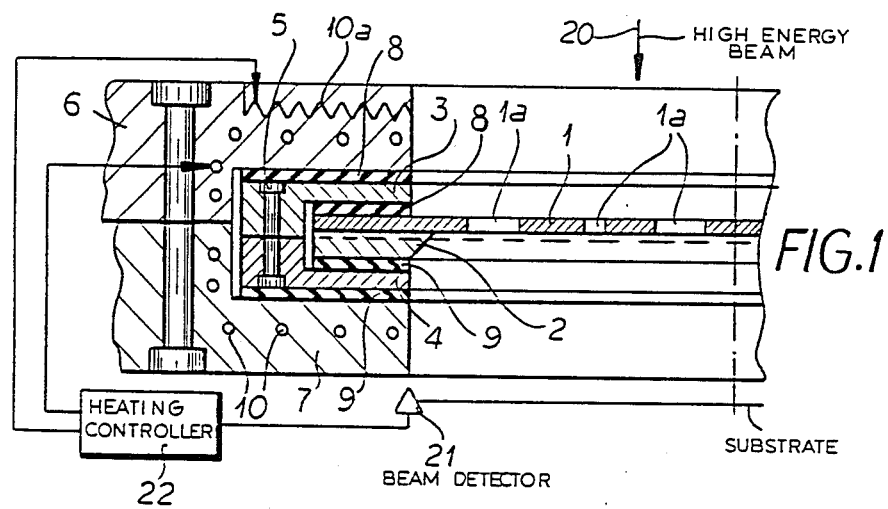
FIG. 1 is a partial cross sectional view of an image forming unit in which a mask comprising a retaining frame and mask foil according to our invention are mounted.
Figure 1A:
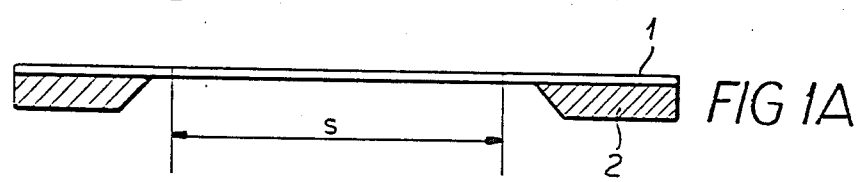
FIG. 1A shows diagrammatically the projection screen out of its frame also in section.

The mask foil 1 shown in the drawing is anchored in the anchoring frame 2 which, for example is composed of silicon. The thickness of the screen mask foil 1 amounts to about 1 to 5 micrometers.

The mask foil 1 is advantageously held together with the anchoring piece 2 in a retaining frame which comprises an upper retaining frame member 3 and a lower retaining frame member 4.

Between the upper retaining frame member 3 and the mask foil 1, particularly however between the anchoring piece 2 and the lower frame member 4, a good heat conducting elastic layer 8, 9 for example of an elastomer is applied. The elastic layer is a protection for the mask foil 1 and the anchoring piece 2 on assembly of the upper frame member 3 and the lower frame member 4 which is frequently composed of brittle material.

The elastic layers 8, 9 compensate for the unevenness of the anchoring piece 2 and as protection against breaking.

The mask foil 1 is held in the retaining frame 3, 4 free of tension or with hardly any tension. The upper frame member 3 and the lower frame member 4 can be attached to each other by screws, one of which can be seen at 5.

The retaining frame for the mask foil 1 of the anchoring piece 2 can be formed by the upper retaining frame member 3 and the lower retaining frame member 4. The planar retaining frame 2 bonded to the mask however can be used as the sole frame structure, the members 3 and 4 being eliminated. The retaining frame facilitates, of course, the manipulation of the mask. The mask foil 1 can be so stressed that its elongation $S1/l_o$ (ratio of a change in a unit length to that unit length) is between $10^{-5}$ and $10^{-6}$.

The increment $S1$ represents the length change with respect to the initial length $l_o$, the initial length $l_o$ corresponding to the length at the reference temperature, that is at room temperature.

With a mask foil diameter of 50 mm an extension or elongation of about 0.5 micrometer over the entire planar state results.

The retaining frame 3, 4 of a good heat conducting material is held in the image forming unit between the plate like clamps 6, 7 of a clamping device.

Between the clamps 6, 7 and the retaining frame 3, 4 heat conducting flexible (elastic) layers 8, 9, for example formed by an elastomer, are disposed.

The clamps 6, 7, composed of a sufficiently good heat conducting material can be provided with channels 10 through which a heating medium—or as need requires a cooling medium—is conducted. Similarly heating wires 10a if necessary in addition to the channels 10 can be provided in the clamps 6, 7 of the clamp device. The mask foil 1 and the retaining frame 3, 4 have advantageously nearly the same thermal expansion coefficient.

In operation, that is, when the image forming medium acts on the mask foil 1, the frame 3, 4 and/or the clamps 6, 7 are heated to a temperature exceeding the temperature of the mask foil 1, for example by conduction of a suitably heated heat carrier through a channel 10 of the clamps 6, 7 and/or by connection of the heated wire built into the clamps 6, 7 to a source of EMF.

Operating temperatures of 100°-200° C. are usual. When one has an operating temperature of 100° C., the frame 3, 4 and/or the clamps 6, 7 are heated to a temperature of for example 110° C. In an INVAR-frame which contains a mask foil of 50 mm diameter that means for example an enlargement of 0.5 micrometer.

Figure 2:
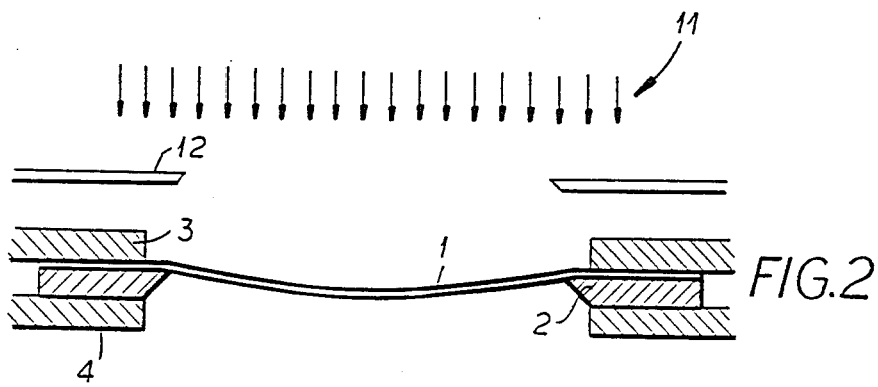
FIG. 2 is a schematic cross sectional view of an image forming unit with a slack mask foil.
Figure 3:
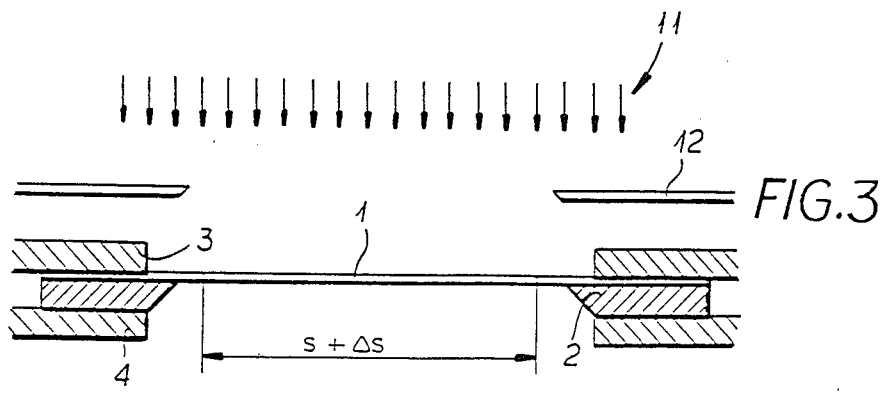
FIG. 3 is a schematic cross sectional view of the image forming unit of FIG. 2 with mask foil taut.

From FIGS. 2 and 3 the condition of a mask used in various projection units is apparent; namely in FIG. 2 in a unit in which heating of the retaining frame 3, 4 is not provided and in FIG. 3 with heating of the retaining frame 3, 4 above the temperature of the mask foil 1 according to our invention.

In the upper portion of FIG. 2 a mask is indicated comprising a mask foil 1 and an anchoring piece 2. On the mask foil an extent s is indicated. When the mask is now heated by an image forming medium 11, for example an ion beam, which—conditioned by an aperature 12—strikes only the mask foil 1 the mask expands and hangs. This leads to a distortion of the image formed. In order to prevent this the frame 3, 4 is heated above the temperature of the mask foil 1, whereby the mask foil 1 is put under tension. The stretch s of the mask foil 1 has increased by approximately $Ss$.

This expansion can, by changing the image formation conditions be optically corrected. Distortions as occur with a sagging mask foil 1 are prevented since the mask foil 1 is planar.

The mask foil 1 is advantageously provided with permeable regions 1a through which the image forming medium 11 passes. These permeable regions 1a can of course be openings in the structure.

The high energy beam 20 is detected pyrometrically, e.g. by a senior 21 which can operate heating controller 22 to regulate the heating fluid flow at 10 or the heating current through heating elements 10a when the high energy beam is cut off, thereby maintaining planarity of the mask.

We claim:

1. In a process for stabilizing a mask comprising a mask foil and a retaining frame for said mask foil which are subjected to a thermal stress by an image-forming medium, including a beam of ions, electrons or X-rays, which passes through a plurality of permeable regions present in said mask foil, the improvement which comprises the steps of:

clamping said mask, whose said mask foil is mounted free of tension or with such a small value of said tension in said retaining frame that a distortion associated with said tension is not present, in said retaining frame; and independently heating said retaining frame during passage of said beam through said permeable regions to a temperature which exceeds the temperature of said make foil in said mask foil produced by said beam during projection imaging of a structure of said regions on a substrate.

2. The improvement according to claim 1 wherein said mask foil is held in said retaining frame with a tension corresponding to an elongation of $10^{-5}$ to $10^{-16}$.

3. The improvement according to claim 2 wherein said retaining frame is heated to a temperature which exceeds that temperature which in necessary in order to hold said make foil planar by about 10° to 20° C.

4. The improvement according to claim 3 wherein on stopping said image-forming medium said make foil is brought to a temperature which is at least equal to said temperature of said mask foil at the time of shut off of said image-forming medium by heating to prevent loss of planarity of the mask.

5. A process for stabilizing a mask comprising a mask foil and a retaining frame for said mask foil which are subjected to a thermal stress by an image forming medium in the form of a beam of ions, electrons or X-rays which passes through at least one permeable region present in said mask foil comprising:

(a) mounting said mask foil free of tension or with such a small value of said tension in said retaining frame that a distortion associated with said tension is not present;

(b) clamping said mask foil in said retaining frame;

(c) heating said retaining frame in operation to a temperature which exceeds the temperature of said mask foil in operation by about 10° to 20° C., and (d) on stopping said image-forming medium heating said mask foil to a temperature at least equal to said temperature of said mask foil at the time of stopping said image-forming medium to maintain planarity of the foil.

6. The improvement according to claim 5 wherein said mask foil is held in said retaining frame with said small value of said tension corresponding to an elongation of $10^{-5}$ to $10^{-6}$.

7. A method of operating a projection screen through which a high-energy beam is passed, comprising the steps of:

bonding a planar frame all around the periphery of a projection mask to form a projection screen, the frame and the mask having substantially the same coefficients of thermal expansion;

securing said projection screen in a mounting frame so that said screen at ambient temperature is subjected to an elongation of at most $10^{-5}$ measured as the ratio of the change in length of a unit length of the mask to said unit length caused by tension in the securing of said projection screen in said mounting frame; and heating said mounting frame to a temperature in excess of that developed in said mask upon the passage of said high-energy beam therethrough to maintain said mask in a planar state; and passing said high-energy beam through said screen.

8. The method defined in claim 7 wherein said projection screen is subjected to tension in said mounting frame so as to generate in said mask an elongation of $10^{-5}$ to $10^{-6}$ therein.

9. The method defined in claim 8 wherein said mounting frame is heated to a temperature of 10° C. to 20° C. above that required to maintain planarity of said mask.

10. The method defined in claim 9, further comprising the step of detecting a termination of passage of said high-energy beam through said mask and at least concurrently with said detection supplying thermal energy to said mounting frame to prevent loss of planarity of said mask.

11. The method defined in claim 9 wherein said mounting frame is heated by clamping it in a clamping frame and electrically heating said clamping frame.

12. The method defined in claim 9 wherein said mounting frame is heated by clamping it in a clamping frame and passing a heating fluid through said clamping frame.

13. The method defined in claim 9 wherein said mounting frame is heated by clamping it in a clamping frame between heat-conductive elastic layers, and heating said clamping frame.

14. The method defined in claim 9 wherein said planar frame bonded to said mask is clamped in said mounting frame between heat-conductive elastic layers.

* * * * *

UNITED STATES PATENT AND TRADEMARK OFFICE
CERTIFICATE OF CORRECTION

PATENT NO. : 4,775,797

DATED : October 4, 1988

INVENTOR(S) : Gerhard Stengl, et al.

It is certified that error appears in the above-identified patent and that said Letters Patent is hereby corrected as shown below:

Title page:

Under U.S. Patent Documents, "4,307,556" should be --4,370,556--;

Col. 1, line 12, "image forming" should be --image-forming--;

Col. 1, line 65, delete "with" after "in";

Col. 2, line 19, change "by" to --from--;

Col. 2, line 26, "substate" should be --substrate--;

Col. 2, line 49, insert "a" after "toward";

Col. 3, line 39, insert --,-- after "example";

Col. 3, line 49, "8,9" should be --8, 9--;

Col. 3, line 54, "8,9" should be --8, 9--;

Col. 3, line 57, "3,4" should be --3, 4--;

Col. 4, line 15, "8,9" should be --8, 9--;

Col. 4, line 56, insert --,-- after "conditions";

Col. 5, line 18, "make" should be --mask--;

Col. 5, line 24, "$10^{-16}$" should be --$10^{-6}$--;

UNITED STATES PATENT AND TRADEMARK OFFICE
CERTIFICATE OF CORRECTION

PATENT NO. : 4,775,797

DATED : October 4, 1988

INVENTOR(S) : Gerhard Stengl, et al.

It is certified that error appears in the above-identified patent and that said Letters Patent is hereby corrected as shown below:

Col. 5, line 31, "make" should be --mask--.

Signed and Sealed this

Seventh Day of March, 1989

Attest:

DONALD J. QUIGG

Attesting Officer     Commissioner of Patents and Trademarks